(12) United States Patent
Minichshofer

(10) Patent No.: US 7,456,691 B2
(45) Date of Patent: Nov. 25, 2008

(54) AMPLIFIER CIRCUIT WITH REDUCED TEMPERATURE DEPENDENCE OF THE GAIN

(75) Inventor: Juergen Minichshofer, Linz (AT)

(73) Assignee: Infineon Technologies AG, Munich (DE)

( * ) Notice: Subject to any disclaimer, the term of this patent is extended or adjusted under 35 U.S.C. 154(b) by 75 days.

(21) Appl. No.: 11/358,729

(22) Filed: Feb. 21, 2006

(65) Prior Publication Data

US 2006/0208802 A1      Sep. 21, 2006

(30) Foreign Application Priority Data

Feb. 21, 2005    (DE) ................... 10 2005 007 876

(51) Int. Cl.
*H03F 1/22* (2006.01)

(52) U.S. Cl. ........................................ 330/289; 330/311

(58) Field of Classification Search ................. 330/289, 330/311, 86
See application file for complete search history.

(56) References Cited

U.S. PATENT DOCUMENTS 4,185,251 A * 1/1980 Brown et al. ................. 330/279
6,232,834 B1 * 5/2001 Zheng ......................... 330/107

\* cited by examiner

*Primary Examiner*—Robert Pascal
*Assistant Examiner*—Hieu P Nguyen
(74) *Attorney, Agent, or Firm*—Maginot, Moore & Beck

(57) ABSTRACT

An amplifier circuit includes an amplifier input, an amplifier output, a control terminal for adjusting a gain of the amplifier circuit, and a feedback path between the amplifier output and the control terminal, wherein a variable-impedance means, the impedance of which depends on a temperature so that a variation of the gain depending on the temperature is reduced, is connected in the feedback path.

23 Claims, 4 Drawing Sheets

PRIOR ART

US 7,456,691 B2

AMPLIFIER CIRCUIT WITH REDUCED TEMPERATURE DEPENDENCE OF THE GAIN

CROSS-REFERENCE TO RELATED APPLICATION

This application claims priority from pending German Patent Application No. 102005007876.1, which was filed on Feb. 21, 2005, and is incorporated herein by reference in its entirety.

BACKGROUND OF THE INVENTION

1. Field of the Invention

The present invention relates to an amplifier circuit with a feedback path.

2. Description of the Related Art

Amplifiers are increasingly used in environments with high temperature fluctuations. For example, the specified temperature ranges for amplifier circuits employed in the automobile area are between −40° C. and 125° C. Here, amplifier circuits exhibiting constant amplification behavior over a great temperature range are required.

Frequently, so-called low-noise amplifiers or LNAs are employed as amplifiers. These LNAs have reduced noise behavior, which is why they are able to amplify signals, without significantly increasing the noise portion of the signals.

FIG. 4 shows a possible amplifier circuit with a low-noise amplifier. In this circuit, a constant current source 1 is attached to a collector or a first terminal of a current mirror transistor 3. At the same time, the constant current source 1 is connected to a control terminal or a base of the current mirror transistor 3 via a current mirror resistor 5. The base of the current mirror transistor 3 is attached to a base or a control terminal of an input transistor 9, which forms the current mirror together with the transistor 5, via the current mirror resistor 5 and an input resistor 7. The constant current source 1 is connected to an emitter or a second terminal of the current mirror transistor 3 as well as to ground via a shunt impedance 11. An emitter or a second terminal of the input transistor 9 is conductively connected to the emitter of the current mirror transistor 3 and attached to ground.

An input terminal 13 is connected to the base of the input transistor 9 and coupled to the base of the current mirror transistor 3 via the resistors 5, 7. A collector or a first terminal of the input transistor 9 is coupled to an emitter or a second terminal of an output transistor 15. A collector or a first terminal of the output transistor 15 is coupled to an output terminal 19 via an output capacitor 17.

The output terminal 19 is coupled to a base or a control terminal of the output transistor 15 via a first feedback capacitor 21, a feedback resistor 23, and a second feedback capacitor 25. At the same time, the base of the output transistor 15 is connected to ground via the second feedback capacitor 25 and a feedback inductance or a feedback inductive element 27.

A bias terminal 29 is conductively connected to the base of the output transistor 15. The collector of the output transistor 15 is connected to a supply voltage terminal 35 via a supply voltage resistor 31 and a supply voltage inductance 33.

The current mirror transistor 3 and the input transistor 9 are arranged in a so-called common emitter arrangement, so that current fed into the circuit from the constant current source 1 at the current mirror transistor 3 is approximately as high as current at the collector of the input transistor 9. The current mirror resistor 5 and the input resistor 7 are designed in high-ohmic manner, so as to diminish reverse influences of signal fluctuations at the input transistor 9 on the current mirror transistor 3. Via the current from the constant current source 1, the working point of the input transistor 9 may be adjusted.

The input transistor 9 is connected between the supply voltage terminal 35 and ground in a cascode circuit with the output transistor 15.

A supply voltage potential is present at the supply voltage terminal 35, whereas a bias is present at the bias terminal 29, if required, via an impedance not shown here.

An alternating voltage signal is applied at the input terminal 13 and amplified by the cascode circuit consisting of the input transistor 9 and the output transistor 15. The signal amplified by the cascode circuit is tapped at the output terminal 19, wherein the output capacitance 17, among other things, serves to filter out potential DC components from the alternating voltage signal at the output terminal.

Via the current from the constant current source 1, the working point and the gain of the cascode circuit are at first predefined. The cascode circuit, the supply voltage inductance 33, and the supply voltage resistor 31 are connected in series between the supply voltage terminal 35 and ground, wherein the supply voltage inductance 33 serves to filter out the reverse influences on the supply voltage terminal 35, which occur in the amplification of an alternating voltage applied at the input. Moreover, the working point and the gain of the cascode circuit may be adjusted via the potential present at the bias terminal 29.

Moreover, via the first feedback capacitor 21, the feedback resistor 23, and the second feedback capacitor 25, the potential present at the output terminal 19 is fed back to the base of the output transistor 15, so that the gain performance of the output transistor 15 is stabilized so as to obtain, for example, a stability factor greater than 1, e.g. in a frequency range up to 10 GHz. The feedback inductance 27 represents a high impedance for the high-frequency alternating current signal in the feedback network.

Among other things, the supply voltage resistor 31 serves for stabilizing the cascode circuit consisting of the input transistor 9 and the output transistor 15.

The amplifier circuit shown in FIG. 4 amplifies alternating voltage present at the input terminal 13. The amplified alternating voltage signal is present at the output terminal 19. Via the value of the direct current provided from the constant current source 1, the working point and thus the gain of the amplifier circuit are preset. Furthermore, the gain of the amplifier circuit is influenced or regulated by a portion of the alternating voltage signal fed back to the base of the output transistor 15 at the output terminal 19. The gain of the amplifier circuit may be varied by suitable choice of the feedback.

In amplifier circuits or LNA concepts, as they are shown in FIG. 4, a simple common emitter structure is employed. In order to minimize the current consumption in mobile systems, the LNAs are supplied with current there, so as to obtain almost temperature-independent overall current consumption.

It is disadvantageous in the amplifier circuit shown in FIG. 4 that it is supplied with constant current, whereby the gain of the amplifier varies over the temperature. This variation is undesirable or too great in some applications.

In the amplifier circuit shown in FIG. 4, it would of course be possible to correctively regulate the gain at a temperature increase via an increase of the constant current from the constant current source 1. This would, however, be connected with increased current consumption of the amplifier circuit, which is disadvantageous particularly with battery-operated applications.

SUMMARY OF THE INVENTION

It is an object of at least some embodiments of the present invention to provide an amplifier circuit in which the gain temperature dependence is reduced.

In accordance with a first aspect, the present invention provides an amplifier circuit, having: an amplifier input; an amplifier output; a control terminal for adjusting a gain of the amplifier circuit; and a feedback path between the amplifier output and the control terminal, wherein a variable impedance, the impedance of which depends on temperature such that variation of the gain depending on the temperature is reduced, is connected in the feedback path.

One idea of embodiments of the present invention is to switch an element the impedance of which varies depending on the ambient temperature into a feedback path of an amplifier circuit, so that the variation of the gain depending on the temperature is reduced. Thus, feedback of an amplifier output signal to a control terminal of an amplifier circuit, at which the gain is adjusted, can be changed depending on the temperature. The feedback of the amplifier output signal may be influenced by the element with temperature-dependent impedance, so that the temperature dependence of the amplifier circuit is reduced.

By a temperature-dependent impedance being switched into the feedback path, the temperature dependence of the amplifier circuit can be reduced in the specified temperature range, for example in a range from –40° C. to 90° C., in which it may be employed. By the reduction of the temperature dependence of the amplifier circuit, the temperature-induced tolerances of a circuit in which the amplifier circuit with reduced temperature dependence is employed can be diminished, for example.

Furthermore, the amplifier circuit with reduced temperature dependence according to an embodiment of the present invention avoids correctively regulating by a constant current source, which feeds the amplifier circuit. In such amplifier circuits, correctively regulating at increasing temperature serves to compensate for the temperature-induced decrease in gain. In this, the constant current has to be adjusted to a higher value with increasing temperature. According to an embodiment of the present invention, the high current consumption that would occur by this correctively regulating of the amplifier circuit at high temperatures can be avoided. With this, the current consumption of a circuit in which the inventive amplifier circuit is employed can be reduced.

Furthermore, by the reduction of the temperature dependence of the amplifier circuit, higher yield in mass production can be achieved. Here, a greater proportion of the amplifier circuits made in mass production has gain lying within the specified tolerances over a specified approved operating temperature range in which the amplifier circuit is to be employed in an electrical device. Thus, the yield in series production of the amplifier circuit is increased by the reduction of the temperature dependence. At the same time, this leads to lower fabrication costs.

Moreover, the reduction of the temperature dependence of the gain of the amplifier circuit in one embodiment of the present invention enables more flexible employment of the amplifier circuit. The amplifier circuit may be employed in applications designed for high ambient temperature, such as in the automobile industry, without downstream circuit elements having to compensate for the temperature-induced reduction of the gain.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
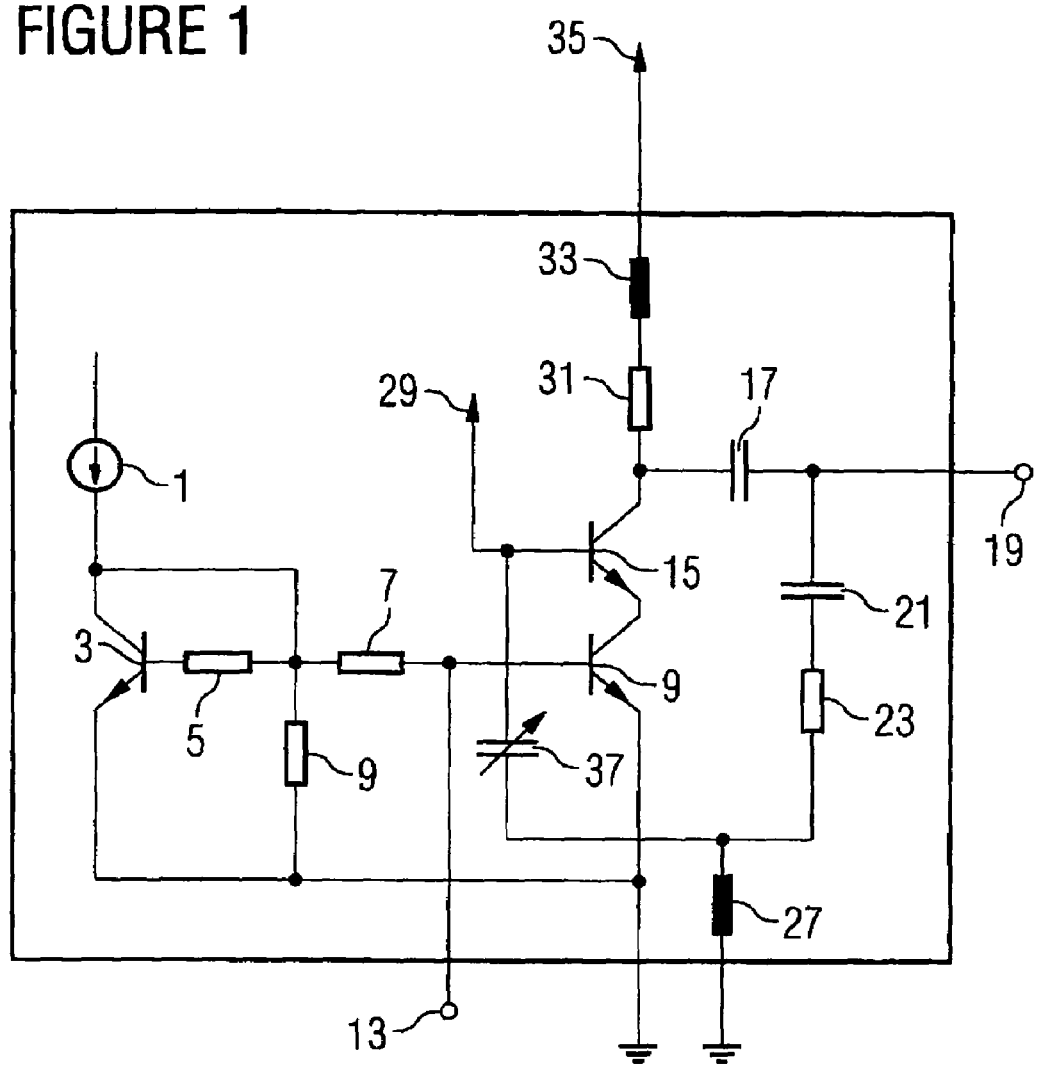
FIG. 1 shows an amplifier circuit with reduced temperature dependence according to a first embodiment of the present invention.

In the subsequent description of the preferred embodiments, the same or similarly acting elements are provided with the same reference numerals. In particular, elements equal to or similarly acting as those from FIG. 4 are provided with the respective same reference numerals, and the following description is limited to illustrating the differences to the construction according to FIG. 4.

Figure 4:
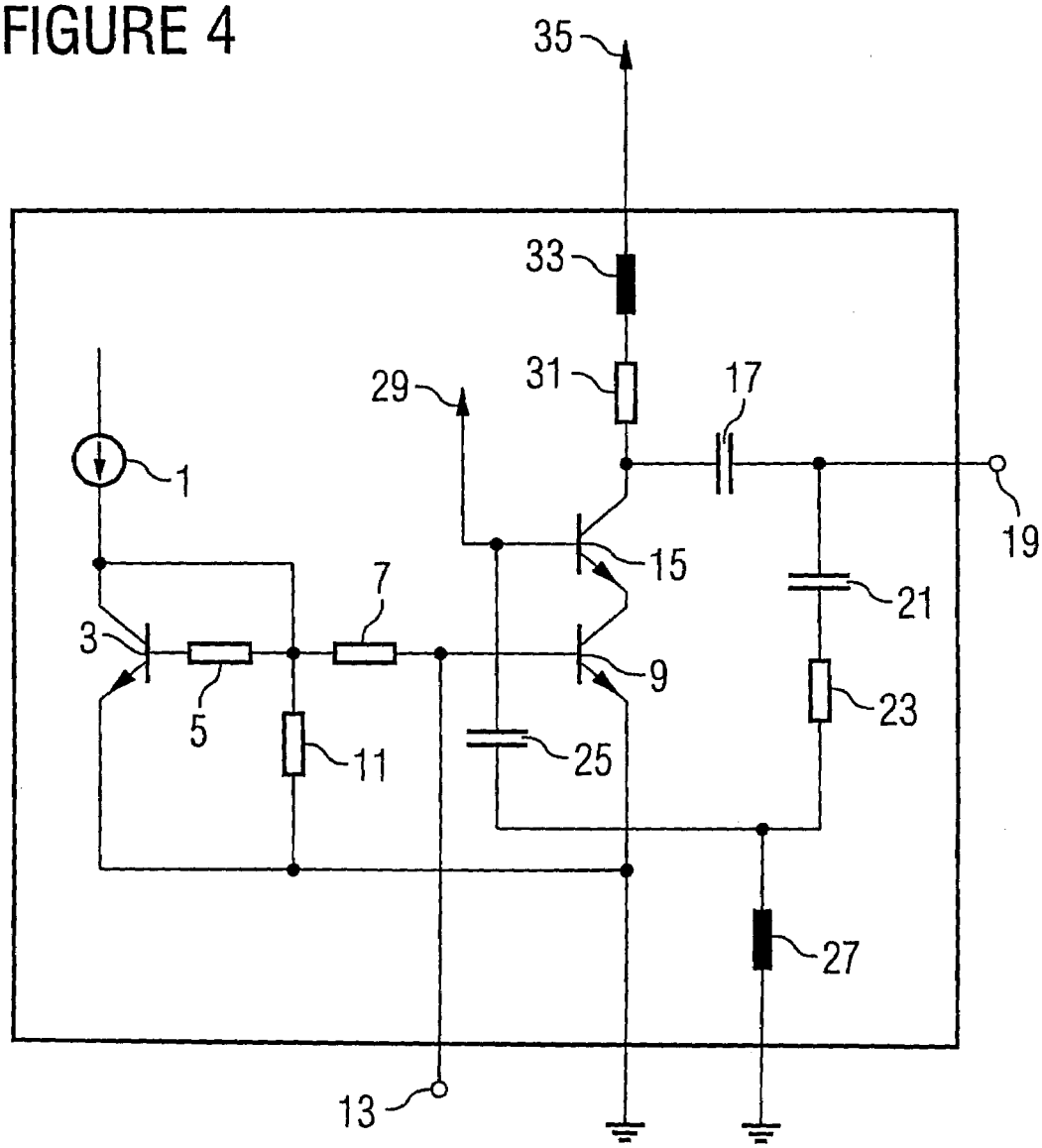
FIG. 4 shows a conventional amplifier circuit.

In contrast to the amplifier circuit shown in FIG. 4, in an amplifier circuit according to an embodiment of the present invention, which is shown in FIG. 1, the second feedback capacitor 25 is replaced by a capacitor 37 with temperature-dependent capacitance. The first feedback capacitor 21, the feedback resistor 23, and the capacitor 37 with temperature-dependent capacitance thus are connected in series between the output terminal 19 and the base of the output transistor 15.

For example, the capacitor with temperature-dependent capacitance 37 is designed so that its capacitance value increases with rising ambient temperature or temperature. Thereby, the impedance of the capacitor 37 with temperature-dependent capacitance decreases with increasing temperature. This leads to the fact that the overall impedance of the feedback network consisting of the capacitor with temperature-dependent capacitance 37, the first feedback capacitor 21, and the feedback resistor 23 decreases with increasing temperature. Thereby, a higher proportion of the alternating voltage signal at the output terminal 19 is fed back to the base of the output transistor 15 with rising ambient temperature.

Thus, the feedback of the alternating voltage present at the output terminal 19 to the base of the output transistor 17 is increased with increasing temperature. This leads to the fact that the gain of the amplifier circuit increases. Thus, a reducing change of the gain of the amplifier circuit by the temperature increase, for example, is compensated for by the increased feedback via the feedback network.

Figure 2:
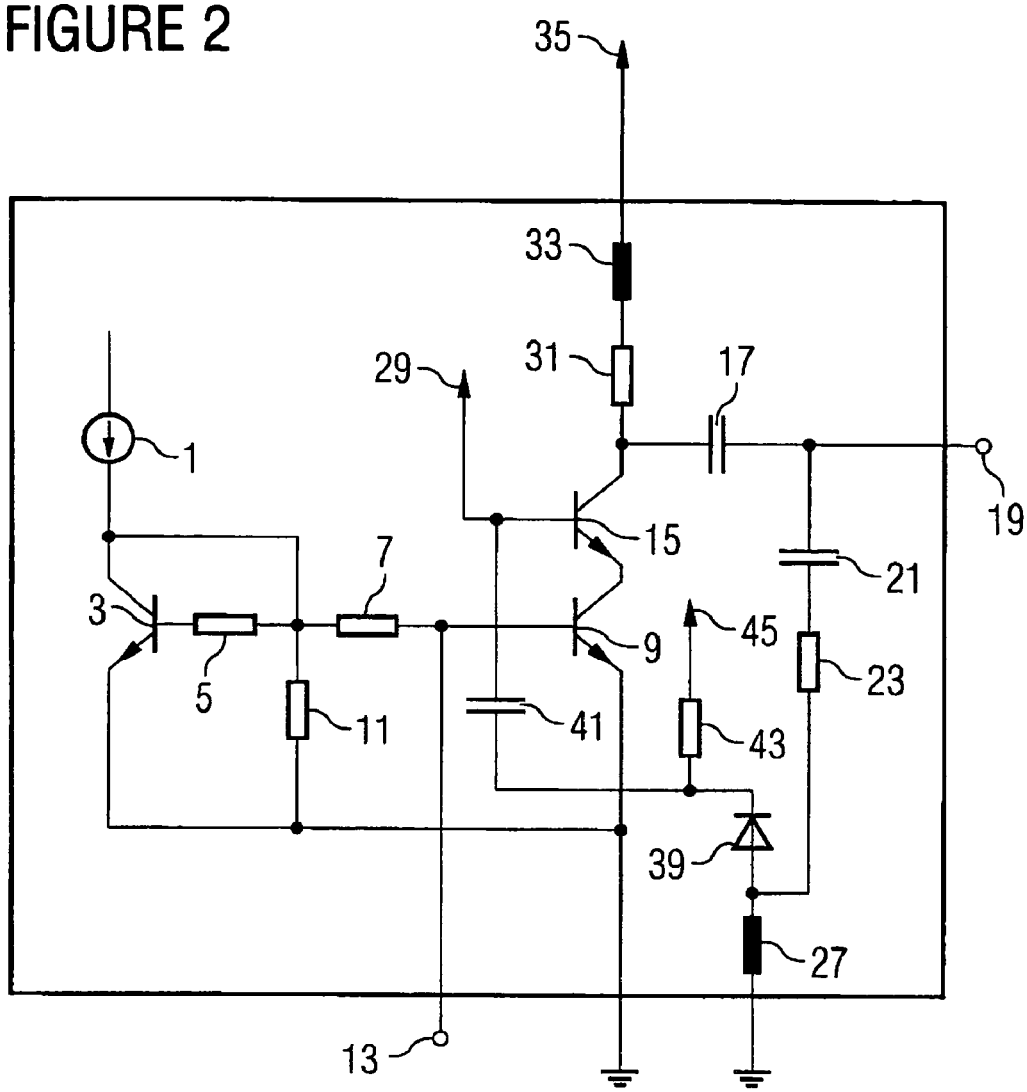
FIG. 2 shows an amplifier circuit with reduced temperature dependence of the gain according to a second embodiment of the present invention.

FIG. 2 shows an amplifier circuit according to a further embodiment of the present invention. The amplifier circuit according to an embodiment of the present invention shown in FIG. 2 differs from the amplifier shown in FIG. 4 in that the second feedback capacitor 25 is replaced by a varactor 39 or a varactor diode and a series capacitor 41. A varactor 39 is a diode that is reverse-biased and the capacitance of which depends on the present voltage or reverse voltage. The varactor 39, the varactor series resistor 43, and the feedback inductance 27 are connected between a varactor potential terminal 45 and ground.

In other words, the circuit illustrated in FIG. 2 results from the circuit illustrated in FIG. 4 by removing the second feedback capacitor 25 in the feedback network in the circuit shown in FIG. 4 and instead switching a series connection of the varactor 39 and the series capacitor 41 between the feedback resistor 23 and the base of the output transistor 15.

Direct voltage is applied between the varactor potential terminal 45 and the ground terminal. This direct voltage drops across a series connection of the varactor series resistor 43, the varactor 39, and the feedback inductance 27. The feedback inductance 27 presents no impedance for the direct voltage here. The direct voltage present between the varactor potential terminal 45 and the ground terminal thus splits into a voltage drop at the varactor 39 and the varactor series resistor 43. Via the direct voltage applied at the varactor potential terminal 45, which is also referred to as tuning voltage, the voltage at the varactor 39 can thus be adjusted. The varactor potential terminal 45 is therefore also sometimes referred to as tune port in the following.

The direct voltage applied at the varactor potential terminal 45 is provided by a temperature-dependent voltage source not shown here, the provided direct voltage decreasing with rising temperature, for example. This leads to the fact that the voltage dropping at the varactor 39 decreases with rising temperature. Thereby, the capacitance of the varactor 39 increases with rising temperature.

The varactor 39 is connected in series with the series capacitor 41 and the first feedback capacitor 21 in the feedback network here. The behavior of the feedback network can be influenced by the ratio of the capacitance of the series capacitor to the capacitance of the varactor. The overall capacitance of the feedback network increases with rising temperature, because the capacitance of the varactor 39 does increase with rising temperature. Thus, the impedance of the feedback network of the first feedback capacitor 21, the feedback resistor 23, the varactor 39, and the series capacitor 41 again drops with increasing temperature. As already explained above, the impedance of the feedback network decreasing with increasing temperature in turn leads to the fact that the gain of the amplifier circuit increases with increasing temperature. Thus, temperature-induced reduction of the gain of the amplifier circuit can in turn be compensated for by a temperature-dependent impedance, which is formed by the varactor 39 in this case. Here, the capacitance of the varactor 39 is adjusted via direct voltage dependent on the ambient temperature and present at the varactor 39.

Figure 3A:
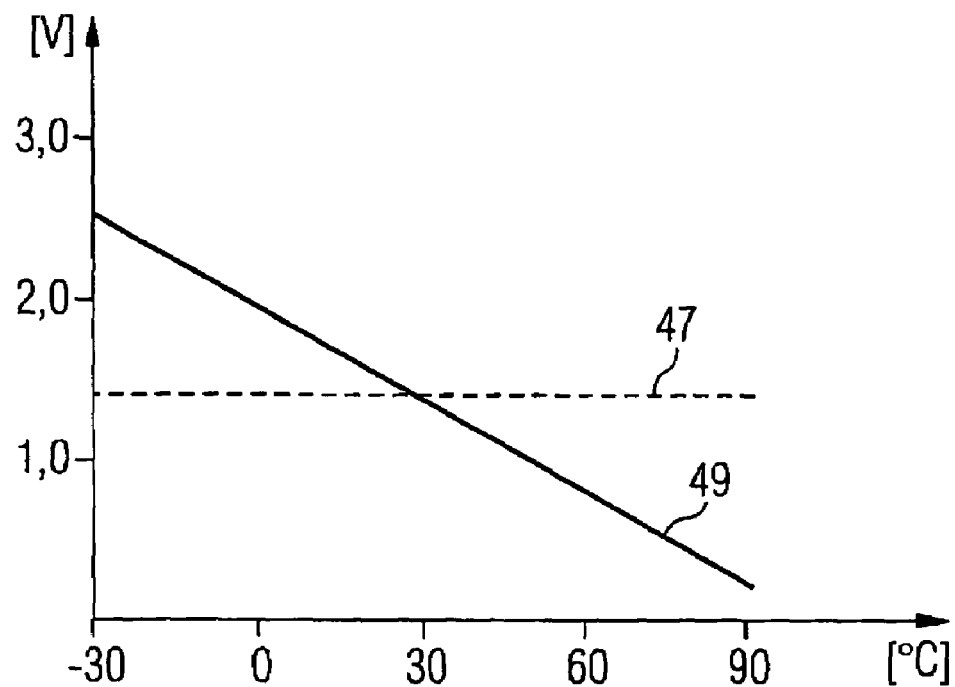
FIGS. 3a-b show a comparison of gain values of an amplifier circuit with reduced temperature dependence of the gain as opposed to an amplifier circuit shown in FIG. 4.

FIG. 3a shows a course of a direct voltage at the varactor 39. This is adjusted via the voltage present at the varactor potential terminal 45. In a graph shown in FIG. 3a, a value of the temperature in degrees Celsius is plotted on an x-axis, whereas the direct voltage at the varactor 39, i.e. the varactor voltage, in volts is plotted on a y-axis.

Here, a dashed line shows a course 47 of the varactor voltage in a first simulation in which the varactor voltage is kept constant over the entire temperature range from −30° C. to 90° C., here at a value of 1.4 volts, for example. This course corresponds to the behavior of the amplifier circuit shown in FIG. 4. The behavior of the amplifier circuit illustrated there can be simulated by means of the capacitance of the varactor 39, with the value of the capacitance of the varactor 39 not changing over the temperature.

A solid line explains a course 49 of the varactor voltage in a second simulation, wherein the varactor voltage linearly decreases from a voltage of 2.5 volts at a temperature of −30° C. down to a value of 0.2 volts at a temperature of 90° C.

Figure 3B:
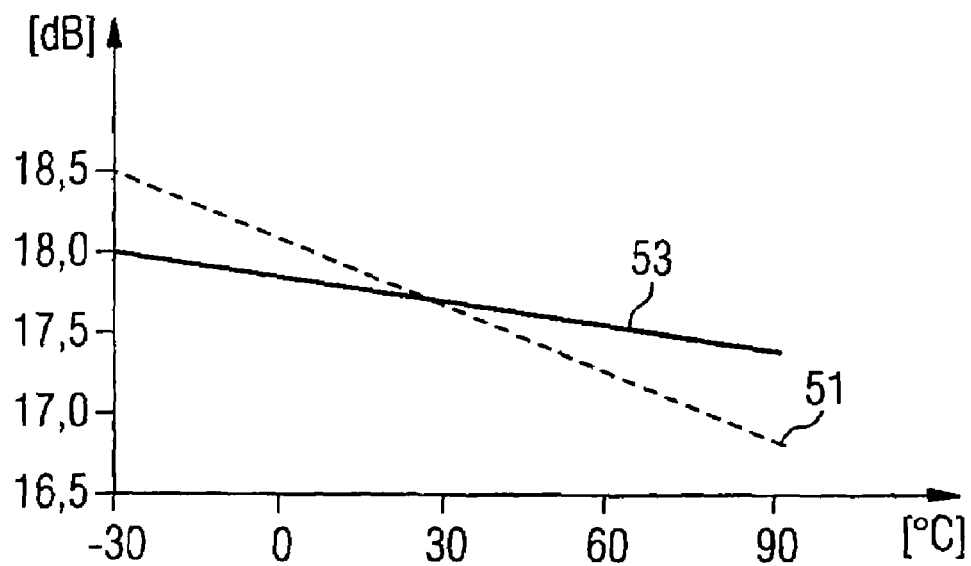

FIG. 3b shows the effects of the different courses of the varactor voltages shown in FIG. 3a on the behavior of the amplifier circuit. In FIG. 3b, the temperature is again plotted on an x-axis in a range from −30° C. to 90° C., whereas the gain of the amplifier circuit in dB is plotted on a y-axis. A dashed line in the graph shown in FIG. 3b shows a course 51 of the gain in the first simulation, and thus a behavior of the amplifier circuit shown in FIG. 4 over the temperature. Here, the voltage at the varactor 39 is kept constant over the temperature. A solid line shows a course 53 of the gain in the second simulation, the behavior of which corresponds to the amplifier circuit according to the embodiment of the present invention explained in FIG. 2. The voltage at the varactor 39 is lowered with increasing temperature, whereby the capacitance of the varactor 39 increases with rising temperature.

From FIG. 3b, it can be seen that the gain of the amplifier circuit according to the second embodiment of the present invention has a value of 18 dB at −30° C. and thus is lower than in the conventional amplifier circuit, in which it has a value of 18.5 dB at a temperature of −30° C. Moreover, the gain of the amplifier circuit according to the embodiment of the present invention shown in FIG. 2 has a value of 17.4 dB at a temperature of 90° C., whereas the conventional amplifier circuit has a value of 16.8 dB at the temperature of 90° C. From the course of the gain of the amplifier circuit over the temperature shown in FIG. 3b, it thus can be seen that the temperature dependence of the gain in the amplifier circuit according to the embodiment of the present invention explained in FIG. 2 is reduced.

By the adjustment of the voltage at the varactor 39 depending on the temperature, the capacitance of the varactor 39 can thus be changed, and hence, as described above, the overall capacitance of the feedback network be adjusted depending on the temperature. The overall capacitance of the feedback network rises with increasing temperature. As described above, this in turn leads to changed or increased feedback of the output signal present at the output terminal 19 to the base of the output transistor 15. Thus, the temperature dependence of the gain of the amplifier circuit is reduced.

In the embodiment of the present invention shown in FIG. 3b, the temperature dependence of the gain of the amplifier circuit could be reduced further by an increase of the capacitance change of the variable capacitance in the feedback path, i.e. by an increase of the capacitance change of the varactor 39.

In above embodiments according to the present invention, a low-noise amplifier circuit is shown as amplifier circuit or high-frequency amplifier. Any alternatives, however, are any amplifier circuits having a feedback path, such as operational amplifier circuits.

In above embodiments, the transistors in the amplifier circuit are embodied as bipolar transistors. Alternatives hereto, however, are also field effect transistors, such as MOS transistors. In above embodiments, the temperature dependent impedance in the feedback network is a capacitance each, the capacitance value of which depends on the temperature. Alternatives hereto, however, are any impedance elements the impedance of which is dependent on the temperature or can be adjusted depending on the temperature, such as NTC (negative temperature coefficient) resistors or PTC (positive temperature coefficient) resistors.

In above embodiments of the present invention, the temperature dependence of the gain of the amplifier circuit has been reduced as compared to a state in which the element with temperature-dependent impedance is missing or the element has temperature-independent impedance, for example. It is also possible, however, to dimension the circuit elements, for example in the feedback path, so that the gain of the amplifier circuit even remains constant over the temperature.

In above embodiments of the present invention, a blind impedance the value of which depends on the temperature is connected in the feedback path, here a capacitor or a varactor. The capacitor or the varactor, however, are only examples of blind impedances the impedance of which depends on the temperature. Further blind impedances, such as inductances, in which the impedance is changed with the temperature via the inductance, for example, are also possible.

In above embodiments of the present invention, the capacitance of the varactor 39 is adjusted via a direct voltage source the value of which depends on the temperature. The voltage source or direct voltage source comprises a controllable voltage source, for example, which is formed to apply a voltage dependent on a control signal to the varactor, wherein the amplifier circuit may further comprise a temperature sensor, for example, which is coupled to the voltage source in order to provide a signal indicating temperature as the control signal. Any arrangements changing direct voltage present at the varactor 39 depending on the temperature are also possible. For example, a temperature sensor could be designed so that it provides a temperature-dependent voltage signal, which adjusts a voltage present at the varactor, in predetermined manner or predefined function.

The temperature sensor could for example be a measuring sensor in which a thermoelement, for example, is integrated, which provides temperature-dependent direct voltage, which could still be amplified an then applied to the varactor 39, for example. A series connection of an ohmic resistor and a temperature-dependent resistor, such as an NTC resistor or PTC resistor, which is applied to a voltage, could also provide temperature-dependent voltage for the adjustment of the capacitance of the varactor 39. Here, the voltage could be tapped at the temperature-dependent resistor, for example.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An amplifier circuit, having:
an amplifier input;
an amplifier output;
a control terminal operably coupled for adjusting a gain of the amplifier circuit; and
a feedback path including a variable impedance disposed between the amplifier output and the control terminal, wherein the variable impedance has an impedance that depends on temperature such that variation of the gain depending on the temperature is reduced;
wherein the variable impedance comprises a varactor, and wherein the varactor is attached to a voltage source designed to apply voltage dependent on the temperature to the varactor, and wherein the voltage source comprises a controllable voltage source formed to apply a voltage dependent on a control signal to the varactor, the amplifier circuit further comprising a temperature sensor coupled to the voltage source in order to provide a signal indicating temperature as the control signal.

2. The amplifier circuit of claim 1, wherein the variable impedance comprises a temperature-dependent capacitance.

3. The amplifier circuit of claim 1, wherein the feedback path further includes an ohmic resistor connected in series with the variable impedance.

4. The amplifier circuit of claim 1, which is embodied as a low-noise amplifier.

5. The amplifier circuit of claim 1, wherein the impedance of the variable impedance is serially connected between the amplifier output and the control terminal.

6. An amplifier circuit, comprising:
an amplifier input;
an amplifier output;
a control terminal operably coupled for adjusting a gain of the amplifier circuit; and
a feedback path including a variable impedance disposed between the amplifier output and the control terminal, wherein the variable impedance has an impedance that depends on temperature such that variation of the gain depending on the temperature is reduced, wherein the feedback path further includes a capacitor with constant capacitance connected in series with the variable impedance.

7. The amplifier circuit of claim 6, wherein the variable impedance comprises a varactor, and wherein the varactor is attached to a voltage source designed to apply voltage dependent on the temperature to the varactor.

8. The amplifier circuit of claim 6, wherein the feedback path further includes an ohmic resistor connected in series with the variable impedance.

9. An amplifier circuit, comprising:
an amplifier input:
an amplifier output:
a control terminal operably coupled for adjusting a gain of the amplifier circuit;
a feedback path including a variable impedance disposed between the amplifier output and the control terminal, wherein the variable impedance has an impedance that depends on temperature such that variation of the gain depending on the temperature is reduced; and
a cascode circuit having an input transistor and an output transistor, wherein the amplifier input is coupled to a transistor control terminal of the input transistor and the amplifier output to a first transistor terminal of the output transistor.

10. The amplifier circuit of claim 9, wherein the feedback path lies between a transistor control terminal of the output transistor and the first transistor terminal of the output transistor.

11. The amplifier circuit of claim 9, wherein a bias source is coupled to a transistor control terminal of the output transistor and is configured provide a bias at a transistor control terminal of the output transistor in order to adjust the gain of the amplifier circuit.

12. The amplifier circuit of claim 11, wherein the bias voltage source is configured to adjust a potential at the transistor control terminal of the output transistor.

13. The amplifier circuit of claim 9, wherein the output transistor includes a bipolar transistor or a field effect transistor.

14. The amplifier circuit of claim 9, wherein the input transistor includes a bipolar transistor or a field effect transistor.

15. The amplifier circuit of claim 9, further comprising a current mirror transistor, wherein the transistor control terminal of the input transistor is coupled to a transistor control terminal of the current mirror transistor, and a second transistor terminal of the input transistor is coupled to a second transistor terminal of the current mirror transistor, and a constant current source is coupled to the transistor control terminal of the current mirror transistor and a first transistor terminal of the current mirror transistor.

16. The amplifier circuit of claim 15, wherein the current mirror transistor includes a bipolar transistor or a field effect transistor.

17. An amplifier circuit, comprising:
- at least one gain element including a control terminal by which a gain of the at least one gain element between a gain element input and a gain element output is adjusted, with the gain showing a first temperature dependency;
- an amplifier output coupled to the gain element output of the at least one gain element;
- a feedback path including a variable impedance disposed between the gain element output and the control terminal, wherein the variable impedance has a second temperature dependency such that variation of the gain due to the first dependency is reduced,
- wherein the at least one gain element comprises a cascode transistor circuit.

18. The amplifier circuit of claim 17, wherein the variable impedance comprises a temperature-dependent capacitance.

19. The amplifier circuit of claim 17, wherein the variable impedance comprises a varactor, and wherein the varactor is attached to a voltage source designed to apply voltage dependent on the temperature to the varactor.

20. The amplifier circuit of claim 17, wherein the cascode transistor circuit comprises an input transistor and an output transistor, wherein an amplifier input is coupled to a transistor control terminal of the input transistor and the amplifier output to a first transistor terminal of the output transistor.

21. The amplifier circuit of claim 17, wherein the feedback path further includes a capacitor with constant capacitance connected in series with the variable impedance.

22. The amplifier circuit of claim 17, wherein the feedback path further includes an ohmic resistor connected in series with the variable impedance.

23. An amplifier circuit, comprising:
- an amplifier input;
- an amplifier output:
- a control terminal operably coupled for adjusting a gain of the amplifier circuit;
- a feedback path including a variable impedance disposed between the amplifier output and the control terminal, wherein the variable impedance has an impedance that depends on temperature such that variation of the gain depending on the temperature is reduced; and
- a gain element comprising a gain element input being coupled to the amplifier input, a gain element output being coupled to the amplifier output and, via the feedback path, to the control terminal, and a gain control input being coupled to the gain control terminal, wherein the gain element is configured to show a gain between the gain element input and the gain element output with the gain being controllable via the gain control input, wherein the gain element comprises a common-emitter circuit.

* * * * *